US007402853B2

(12) United States Patent
Kim et al.

(10) Patent No.: US 7,402,853 B2
(45) Date of Patent: Jul. 22, 2008

(54) BST INTEGRATION USING THIN BUFFER LAYER GROWN DIRECTLY ONTO $SIO_2$/SI SUBSTRATE

(75) Inventors: Il-Doo Kim, Cambridge, MA (US); Ytshak Avrahami, Arlington, MA (US); Harry L. Tuller, Wellesley, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 257 days.

(21) Appl. No.: 11/230,100

(22) Filed: Sep. 19, 2005

(65) Prior Publication Data

US 2006/0068560 A1 Mar. 30, 2006

Related U.S. Application Data

(60) Provisional application No. 60/611,226, filed on Sep. 17, 2004.

(51) Int. Cl.
*H01L 29/80* (2006.01)

(52) U.S. Cl. ........................................ 257/275; 438/48

(58) Field of Classification Search ................ 257/275, 257/728

See application file for complete search history.

(56) References Cited

U.S. PATENT DOCUMENTS 6,045,932 A * 4/2000 Jia et al. ..................... 428/702
6,764,864 B1 * 7/2004 Li et al. ......................... 438/3
2001/0044164 A1 * 11/2001 Jaing et al. ..................... 438/48
2001/0054748 A1 * 12/2001 Wikborg et al. ............. 257/595
2003/0022030 A1 * 1/2003 Chang ......................... 428/701
2003/0136998 A1 * 7/2003 Baniecki et al. ............. 257/310
2004/0017270 A1 * 1/2004 Nagra et al. ................ 333/156
2004/0028838 A1 * 2/2004 Chang ......................... 427/596
2004/0069991 A1 * 4/2004 Dunn et al. .................... 257/75
2004/0183624 A1 * 9/2004 Liang et al. ................. 333/134
2006/0035023 A1 * 2/2006 Chang ...................... 427/249.1
2006/0082423 A1 * 4/2006 Kim et al. ................... 333/158

OTHER PUBLICATIONS

Fenner, D.B. et al, "Reactions at the interfaces of thin films of Y-Ba-Cu and Zr-oxides with Si substrates," American Institute of Physics, Feb. 15, 1991, pp. 2176-2182.

Bae, S-Y et al., "Magnetic Properties of sol-gel derived Ni-Zn ferrite thin films on yttria stabilized zirconia buffered Si (10)." Journal of Applied Physics, vol. 85 No. 8, Apr. 15, 1999, pp. 5226-5228.

Honstu, S. et al., YBa2Cu3O7-y microbridges on Y2O3/yttria-stabalized zirconia/SiO2/Si(100). 1992 American Institute of Physics. Appl. Phys. Lett. 61 (22), Nov. 30, 1992, pp. 2709-2711.

(Continued)

*Primary Examiner*—Thao P. Le
(74) *Attorney, Agent, or Firm*—Gauthier & Connors LLP

(57) ABSTRACT

A BST microwave device includes a substrate and an insulating layer that is formed on the substrate. A buffer layer is formed on the insulating layer. A BST layer is formed on the buffer layer with a selected orientation for high tunability and possesses a low loss in a wavelength of interest.

15 Claims, 1 Drawing Sheet

OTHER PUBLICATIONS

Cole et al., "Evaluation of Ta2O5 as a buffer layer film for integration of microwave tunable Bal-xSrxTiO3 based thin films with silicon substrates" Journal of Applied Physics, vol. 92, No. 7, Oct. 1, 2002, pp. 3967-3973.

Sungjin et al., "Dielectric properties of strained (Ba, Sr) TiO3 thin films epitaxially grown on Si with thin film yttria-stabalized zirconia buffer layer" Applied Physics Letters, American Institute of Physics, vol. 78, No. 17, Apr. 23, 2001, pp. 2542-2544.

Database Inspection, The Institute of Electrical Engineers, Stevange GB, Inspec. No. AN7192407, Mar. 2001, Nagel et al., "Three Dimensional (Ba, Sr) TiO3 stack capacitors for DRAM application" XP002360199 (Abstract).

Kim et al., "Epitaxial BaxSr1-xTiO3 Thin Films For Microwave Phase Shifters" Microwave Conference 2000, Dec. 3, 2000, pp. 934-937.

Lee et al., "Electrical Properties of SRB12TA209/Insulators/SI Structures with Various Insulators" Japanese Journal of Applied Physics vol. 38, Part I No. 4A, Apr. 1999, pp. 2039-22043.

Basit et al., "Growth of highly oriented Pb(Zr, Ti) O3 films on MgO-buffered oxidized Si substrates and its application to ferroelectric nonvolatile memory field-effect transistors" American Institute of Physics, Applied Physics Letters, vol. 73, No. 26, Dec. 28, 1998, pp. 3941-3943.

* cited by examiner

BST INTEGRATION USING THIN BUFFER LAYER GROWN DIRECTLY ONTO $SiO_2$/SI SUBSTRATE

PRIORITY INFORMATION

This application claims priority from provisional application Ser. No. 60/611,226 filed Sep. 17, 2004, which is incorporated herein by reference in its entirety.

BACKGROUND OF THE INVENTION

The invention relates to the field of microwave tunable devices, and in particular to microwave tunable devices on Si based wafers.

In the past few years, the use of high-permittivity ferroelectric materials such as $(Ba,Sr)TiO_3$, $SrTiO_3$, $(Ba,Zr)TiO_3$, $(Ba,Hf)TiO_3$, $Bi_{1.5}Zn_{1.0}Nb_{1.5}O_7$ and related thin films have been widely studied due to an increasing need for smaller size, light weight, higher power, and lower cost frequency agile components. It will be appreciated by those of skill in the art that BST is representative of one or more related perovskite-like tunable dielectric materials. There is a great incentive to replicate these achievements on silicon based wafers for integrated microwave device applications. If one makes BST integrated tunable circuit on Si substrate directly, mass production process can be easily realized through large size availability of Si wafers and the widespread industrial use of Si-based processing technology. However, BST films grown directly onto Si suffer from low tunability due to the formation of low-K $SiO_2$ thin layers between BST and Si during the requisite high temperature BST deposition process. Also, the crack is easily observed on the surface of BST films.

Technically, the growth of high quality BST films on $SiO_2$/Si can be a formidable challenge because of the inherent crystallographic incompatibility of two materials. In order to solve these problems, firstly, thick $SiO_2$ layer more than 2 μm is required as the substrate for the minimization of microwave insertion losses of normal Si with low resistivity of 10 Ωcm is associated with loss tangent related to conductivity in the silicon substrate. Secondly, suitable oxide buffer layers are required between top BST layer and Si substrates to control the orientation and quality of the BST films.

The buffer layer between Si and BST plays a major role in determining the quality of the film and its microwave loss properties. However, oxides which can be grown epitaxially on Si substrate are limited. $TiO_2$, MgO, $LaAlO_3$, $Al_2O_3$, YSZ, $CeO_2$ are, for example, possible candidates. Generally, the Si substrate introduces high microwave loss due to the low resistivity of Si.

SUMMARY OF THE INVENTION

According to one aspect of the invention, there is provided a BST microwave device. The BST microwave device includes a substrate and an insulating layer that is formed on the substrate. A buffer layer is formed on the insulating layer. A BST layer is formed on the buffer layer with a selected orientation for high tunability and possesses a low loss in a wavelength of interest.

According to another aspect of the invention, there is provided a method of forming a BST microwave device. The method includes providing a substrate and forming a insulating layer that is formed on the substrate. A buffer layer is formed on the insulating layer. Also, the method includes forming a BST layer on the buffer layer with a selected orientation for high tunability and possesses a low loss in a wavelength of interest.

DETAILED DESCRIPTION OF THE INVENTION

The integration of microwave tunable devices on Si based wafers is limited to material systems that are compatible with Si technology. The use of SOI (Silicon on Insulator) wafers to achieve the integration of BST or $Bi_{1.5}Zn_{1.0}Nb_{1.5}O_7$ (BZN series, B : Bi, Ba) on Si are known. There are advantages, however, to obtaining oriented BST films directly on an insulating layer buffered Si, namely lower costs and simpler processing.

Figure 1A:
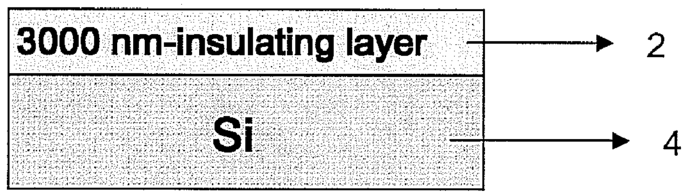
FIGS. 1A-1C are schematic diagrams illustrating the formation of BST films directly on insulating layer buffered Si including microwave buffer layers.
Figure 1B:
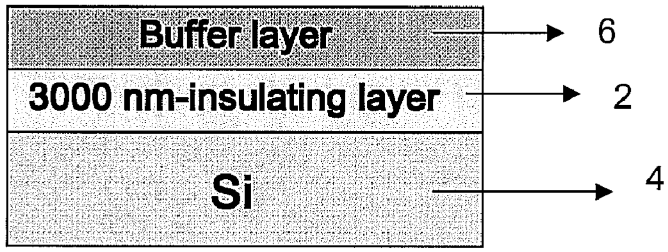
Figure 1C:
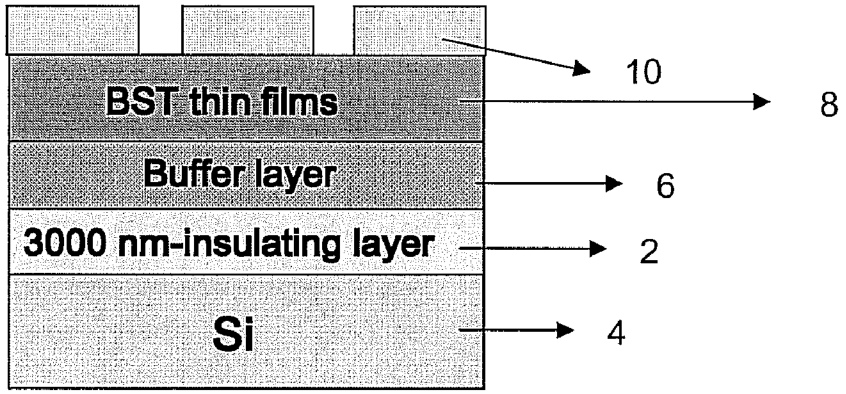

FIGS. 1A-1C are schematic diagrams illustrating the formation of BST formed directly on insulating layer buffered Si. FIG. 1A shows a thick layer 2 of insulating layer of ~3000 nm is grown onto a Si substrate 4 to electrically separate the BST microwave layer from the lossy Si substrate 4 underneath. The insulating layer 2 can include or consist of, for example, silicon sioxide ($SiO_2$), silicon nitride ($Si_3N_4$ or other composition), aluminum oxide, magnesium oxide, and/or other dielectric materials, or may be a multilayer structure including one or more different materials. The insulator layer 4 can have a thickness $t_1$ ranging from approximately 2 to 10 or more (e.g., up to approximately 100) μm, although the preferred thickness $t_1$ range is approximately 3 to 10 μm FIG. 1B shows a thin buffer layer 6 that is then grown onto the insulating layer/Si structure.

The buffer layer 6 thickness of about 50 nm is sufficient to achieve epitaxial and/or highly preferred orientated or polycrystalline growth of BST. The buffer layer 6 must satisfy two key requirements: 1) appropriate orientation and 2) low dielectric loss. The buffer layer 6 orientation should be such as to induce the BST film to grow in the desired orientation for high tunability and it should possess a low loss in the wavelength of interest. Materials suitable to serve as buffer layers include $TiO_2$, MgO, $LaAlO_3$, $Al_2O_3$, YSZ, $CeO_2$, and $MgAl_2O_4$, BaO, SrO, $Bi_{1.5}Zn_{1.0}Nb_{1.5}O_7$ (BZN series, B : Bi, Ba). Also very thin $Ba_{1-x}Sr_xTiO_3$ (x=1~0.7) seed layer (thickness is less than 50 nm) can be used to control the BST orientation.

FIG. 1C shows BST films 8 that are grown onto the buffer layer 6 followed by fabrication of the microwave tunable devices such as voltage tunable phase shifter, resonator, and tunable filters. As an example, a standard coplanar waveguide structure can be easily fabricated in BST with standard e-beam lithography and/or standard photolithography and lift-off process. Also, Au electrodes 10 are formed on the BST films 8. The BST films include a dielectric materials, such as (Ni, Mn, Mg) doped BST, $SrTiO_3$, $Bi_{1.5}Zn_{1.0}Nb_{1.5}O_7$.

Although the present invention has been shown and described with respect to several preferred embodiments thereof, various changes, omissions and additions to the form and detail thereof, may be made therein, without departing from the spirit and scope of the invention.

What is claimed is:

1. A BST microwave device comprising:

a substrate;

an insulating layer having a thickness of 2 μm that is formed on said substrate;

a buffer layer that is formed on said insulating layer; and a BST layer that is directly formed on said buffer layer with a selected orientation for high tunability and possess a low loss in a wavelength of interest.

2. The BST microwave device of claim 1, wherein said substrate comprises Si.

3. The BST microwave device of claim 1, wherein said insulating layer comprises a material selected from the group consisting of silicon dioxide ($SiO_2$), silicon nitride ($Si_3N_4$ or other composition), aluminum oxide, magnesium oxide, and/or other dielectric materials, or may be a multilayer structure including one or more different materials.

4. The BST microwave device of claim 1, wherein said buffer layer comprises $TiO_2$, MgO, $LaAlO_3$, $Al_2O_3$, YSZ, $CeO_2$, SrO, BaO and $MgAl_2O_4$, $Bi_{1.5}Zn_{1.0}Nb_{1.5}O_7$ (BZN series, B : Bi, Ba).

5. The BST microwave device of claim 1, wherein said buffer layer comprises a thickness selected from a range of approximately 30 nm to approximately 200 nm.

6. The BST microwave device of claim 1, wherein said selected orientation is formed by using a very thin $Ba_{1-x}Sr_xTiO_3$ (x=1~0.7) seed layer.

7. The BST microwave device of claim 1, wherein said BST layer is used to form a microwave tunable device.

8. The BST microwave device of claim 1, wherein said BST layer has a thickness selected from a range of approximately 500 nm to 2000 nm.

9. The BST microwave device of claim 1, wherein said microwave tunable device comprises a voltage tunable phase shifter, resonator, or tunable filter.

10. A method of forming a BST microwave device comprising:

providing a substrate;

forming an insulating layer having a thickness of 2 μm thick that is formed on said substrate;

forming a buffer layer on said insulating layer; and forming a BST layer directly on said buffer layer with a selected orientation for high tunability and possess a low loss in a wavelength of interest.

11. The method of claim 10, wherein said substrate comprises Si.

12. The method of claim 10, wherein said buffer layer comprises $TiO_2$, MgO, $LaAlO_3$, $Al_2O_3$, YSZ, $CeO_2$, SrO, BaO and $MgAl_2O_4$, $Bi_{1.5}Zn_{1.0}Nb_{1.5}O_7$ (BZN series, B : Bi, Ba).

13. The method of claim 10, wherein said selected orientation is formed by using a very thin $Ba_{1-x}Sr_xTiO_3$ (x=1~0.7) seed layer.

14. The method of claim 10, wherein said BST layer is used to form a microwave tunable device.

15. The method of claim 10, wherein said microwave tunable device comprises a voltage tunable phase shifter, resonator, or tunable filter.

* * * * *